(12) United States Patent
Shimoji et al.

(10) Patent No.: US 8,093,586 B2
(45) Date of Patent: Jan. 10, 2012

(54) HYBRID ORGANIC LIGHT-EMITTING TRANSISTOR DEVICE AND MANUFACTURING METHOD THEREOF

(75) Inventors: Noriyuki Shimoji, Kyoto (JP); Suguru Okuyama, Kyoto (JP); Yoshiaki Oku, Kyoto (JP)

(73) Assignees: Pioneer Corporation, Tokyo (JP); Rohm Co., Ltd., Kyoto (JP)

( * ) Notice: Subject to any disclaimer, the term of this patent is extended or adjusted under 35 U.S.C. 154(b) by 96 days.

(21) Appl. No.: 12/450,462

(22) PCT Filed: Jan. 30, 2008

(86) PCT No.: PCT/JP2008/051357
§ 371 (c)(1),
(2), (4) Date: Sep. 28, 2009

(87) PCT Pub. No.: WO2008/126449
PCT Pub. Date: Oct. 23, 2008

(65) Prior Publication Data
US 2010/0065831 A1 Mar. 18, 2010

(30) Foreign Application Priority Data
Mar. 30, 2007 (JP) ................................. 2007-091899

(51) Int. Cl.
*H01L 35/24* (2006.01)
*H01L 51/00* (2006.01)
*H01L 29/04* (2006.01)
*H01L 27/15* (2006.01)
*H01L 33/00* (2006.01)

(52) U.S. Cl. ................. 257/40; 257/79; 257/72; 257/88

(58) Field of Classification Search ................ 257/40, 257/24, 103, 59, 72, 707, 79, 796, 98, 100, 257/625, 84, 499, 443, 448, 88
See application file for complete search history.

(56) References Cited

U.S. PATENT DOCUMENTS
6,150,668 A 11/2000 Bao et al.
(Continued)

FOREIGN PATENT DOCUMENTS
JP 2000-029403 A 1/2000
(Continued)

OTHER PUBLICATIONS
"Organic Transistor Circuits for Application to Organic Light-Emitting-Diode Displays", Masatoshi Kitamura et al., Jpn. J. Appl. Phys., vol. 42 (2003) pp. 2483-2487.
(Continued)

*Primary Examiner* — Chuong A. Luu
(74) *Attorney, Agent, or Firm* — Rabin & Berdo, PC (57) ABSTRACT

A hybrid organic light-emitting transistor device and a manufacturing method thereof are provided. The hybrid organic light-emitting transistor device includes at least one organic light-emitting diode device and at least one organic thin-film transistor device placed on the same substrate. The organic light-emitting diode device has a first organic layer placed between an anode and a cathode, and the organic thin-film transistor device has a second organic layer placed on a source electrode and a drain electrode. The first organic layer and the second organic layer are spatially isolated from each other, and an organic material forming the second organic layer is identical to an organic material forming the first organic layer. The hybrid organic light-emitting transistor with a reduced pixel size and an improved aperture ratio can be easily obtained.

5 Claims, 3 Drawing Sheets

U.S. PATENT DOCUMENTS

| | | |
|---|---|---|
| 6,836,067 B1 | 12/2004 | Imai |
| 2004/0041146 A1* | 3/2004 | Cheng et al. .................. 257/40 |
| 2006/0131568 A1 | 6/2006 | Meng et al. |
| 2006/0261331 A1 | 11/2006 | Yukawa |
| 2010/0084638 A1* | 4/2010 | Hotta et al. .................. 257/40 |

FOREIGN PATENT DOCUMENTS

| | | |
|---|---|---|
| JP | 2000-068071 A | 3/2000 |
| JP | 2000-252550 A | 9/2000 |
| JP | 2003-241689 A | 8/2003 |
| JP | 2003-255857 A | 9/2003 |
| JP | 2004-087458 A | 3/2004 |
| JP | 2005-135978 A | 5/2005 |
| JP | 2005-294286 A | 10/2005 |
| JP | 2006-203073 A | 8/2006 |
| JP | 2006-352093 A | 12/2006 |

OTHER PUBLICATIONS

"Active Matrix Organic Light Emitting Diode Panel using Organic Thin Film Transistors", Takashi Chuman et el., Pioneer R&D, vol. 15, No. 2, Aug. 31, 2005, pp. 62-69.

* cited by examiner

HYBRID ORGANIC LIGHT-EMITTING TRANSISTOR DEVICE AND MANUFACTURING METHOD THEREOF

TECHNICAL FIELD

The present invention relates to a hybrid organic light-emitting transistor device that includes at least one organic light-emitting diode (OLED) device and at least one organic thin-film transistor (organic TFT) device, as well as a manufacturing method thereof.

BACKGROUND ART

An organic electroluminescence (referred to as organic EL hereinafter) display is a self-luminous type display and has advantages for example that the organic EL display is thin and lightweight and consumes less power. Therefore, the organic EL display has been actively studied and developed in these years for use as a display device such as FPD (flat panel display).

The driving scheme for the organic EL display is categorized into the passive matrix scheme and the active matrix scheme. The passive matrix scheme drives organic EL devices (OLED devices) line by line using stripe-arranged scanning electrodes and stripe-arranged data electrodes orthogonal to the scan electrodes. The active matrix scheme provides a switching transistor (select transistor) and a driving transistor at each pixel for driving organic EL devices (OLED devices). Since the active matrix scheme can control current for each pixel and is accordingly advantageous in terms of reduction of the power consumption of the organic EL display and extension of the lifetime of the organic EL devices.

In the conventional active-matrix-driven organic EL display as described above, a silicon-based semiconductor material such as amorphous silicon (a-Si) or polysilicon (poly-Si) is used in most cases as a material for an active layer of the switching transistor or driving transistor used in the organic EL display. Recently, instead of the silicon-based thin-film transistor (TFT), an organic TFT using an organic semiconductor material or TFT using a transparent semiconductor such as ZnO has been proposed. For example, Japanese Patent Laying-Open No. 2003-255857 (Patent Document 1) and Takashi Chuman et al., "PIONEER R&D", Vol. 15, No. 2, Aug. 31, 2005, pp. 62-69 (Non-Patent Document 1) each disclose a hybrid organic light-emitting transistor including an organic EL device and an organic TFT device arranged on the same substrate in which an organic semiconductor material such as naphthalene or pentacene is used for an active layer of the organic TFT. In the active-matrix-driven organic EL display using the organic TFT, the organic TFT and the organic EL device can be formed on a plastic substrate for example. Thus, a flexible and lightweight organic EL display using such an organic TFT and an organic EL device is expected to be realized.

The hybrid organic light-emitting transistor including an organic EL device and an organic TFT device arranged in parallel on the same substrate as disclosed in the above-referenced documents, however, has the problems for example as described below. First of all, in the conventional hybrid organic light-emitting transistor as described above, different organic materials are used for respective active layers of the organic TFT device and the organic EL device. Therefore, a shadow mask of SUS or the like is necessary in the process of forming each device. At this time, a large alignment margin has to be secured in consideration of the precision in mask alignment. In particular, the recent increase in screen size of the display is accompanied by the increased substrate size, a larger substrate leads to a more noticeable displacement of the shadow mask particularly near the end face of the substrate, because of a difference in thermal expansion coefficient between glass commonly used as a material for the substrate and SUS used as a material for the shadow mask, and therefore, a sufficiently large margin is required. It is accordingly difficult to make the pixel smaller, enhance the resolution and increase the screen size of the display. Further, because of the required larger alignment margin in consideration of misalignment of the shadow mask, a larger device isolation width (distance between the organic EL device and the organic TFT device) is accordingly required, resulting in a problem that the ratio of the light emitting element (organic EL device) area to the pixel area (aperture ratio) cannot be increased. Furthermore, because the shadow mask contacts the surface where the device is formed, dust is likely to be generated due to the contact, resulting in a problem of deterioration in yield.

Moreover, the organic EL device and the organic TFT device have to be produced in separate process steps, resulting in a problem that the manufacturing process is complicated.

Patent Document 1: Japanese Patent Laying-Open No. 2003-255857
Non-Patent Document 1: Takashi Chuman et al., "PIONEER R&D", Vol. 15, No. 2, Aug. 31, 2005, pp. 62-69

DISCLOSURE OF THE INVENTION

Problems to be Solved by the Invention

The present invention has been made to solve the problems above, and an object of the invention is to provide a hybrid organic light-emitting transistor with a reduced pixel size and an improved aperture ratio. Another object of the invention is to provide a method according to which the hybrid organic light-emitting transistor can be easily produced.

Means for Solving the Problems

According to the present invention, a hybrid organic light-emitting transistor device including at least one organic light-emitting diode device and at least one organic thin-film transistor device placed on the same substrate is provided. The organic light-emitting diode device has a first organic layer placed between an anode and a cathode, and the organic thin-film transistor device has a second organic layer placed on a source electrode and a drain electrode. The first organic layer and the second organic layer are spatially isolated from each other, and an organic material forming the second organic layer is identical to an organic material forming the first organic layer.

The first organic layer and the second organic layer each may be constituted of at least two layers, the number of constituent layers of the first organic layer is identical to the number of constituent layers of the second organic layer. In this case, respective organic materials forming the constituent layers of the second organic layer are respectively identical to respective organic materials forming the constituent layers of the first organic layer.

The second organic layer includes an active layer made of an organic semiconductor material formed in contact with the source electrode and the drain electrode, and preferably the first organic layer includes a hole injection layer made of the same material as the organic semiconductor material forming the active layer.

The organic thin-film transistor device may further have a layer formed on the second organic layer and made of a material identical to a material for the cathode of the organic light-emitting diode device.

Preferably, the hybrid organic light-emitting transistor device of the present invention includes at least two organic thin-film transistor devices that are an organic thin-film transistor device for driving the organic light-emitting diode device and an organic thin-film transistor device for selecting a light-emitting pixel.

The hybrid organic light-emitting transistor device of the present invention may further include a color filter for converting a wavelength of light emitted from the organic light-emitting diode device.

Further, according to the present invention, a method of manufacturing a hybrid organic light-emitting transistor device is provided, the hybrid organic light-emitting transistor device includes at least one organic light-emitting diode device having a first organic layer placed between an anode and a cathode, and at least one organic thin-film transistor device having a second organic layer placed on a source electrode and a drain electrode, the organic light-emitting diode device and the organic thin-film transistor device being formed on the same substrate. The method includes the steps of: (A) forming a gate electrode of the organic thin-film transistor device on the substrate; (B) forming a gate insulation film at least partially on the gate electrode; (C) forming on the gate insulation film the source electrode and the drain electrode of the organic thin-film transistor device and the anode of the organic light-emitting diode device; (D) forming ribs made of a resist in a predetermined region; (E) forming the first organic layer and the second organic layer using the same organic material in respective depressed portions formed by the ribs; and (F) forming the cathode of the organic light-emitting diode device on the first organic layer.

In this step (E), the first organic layer and the second organic layer may be formed by stacking a plurality of layers. In this case, preferably a lowermost layer of the first organic layer and the second organic layer is made of an organic semiconductor material.

In this step (F), preferably the cathode of the organic light-emitting diode device is formed on the first organic layer, and a layer of a material identical to a material for the cathode is formed on the second organic layer.

Effects of The Invention

In the hybrid organic light-emitting transistor device of the present invention, the same organic material is used for the organic layer of the organic light-emitting diode device and the organic layer of the organic thin-film transistor device. Therefore, a shadow mask is unnecessary in forming these organic layers. The present invention thus overcomes the problems of the conventional art arising from the mask, and can provide the hybrid organic light-emitting transistor device with a reduced pixel size and an improved aperture ratio. Accordingly, a higher resolution and an increased screen size of the resultant organic EL display can be achieved.

According to the method of manufacturing a hybrid organic light-emitting transistor device of the present invention, the organic layer of the organic light-emitting diode device and the organic layer of the organic thin-film transistor device can be formed simultaneously without using a shadow mask, so that the manufacturing process can be remarkably simplified. Further, deterioration of the yield due to dust or the like caused by contact with the mask is improved.

DESCRIPTION OF THE REFERENCE SIGNS 101, 201, 301 substrate, 102, 202, 320 organic light-emitting diode device (OLED device), 103, 203, 220, 330, 340 organic thin-film transistor device (organic TFT device), 104, 204, 310 anode, 105, 205, 314 cathode, 106, 206, 311 first organic layer, 107, 207 organic semiconductor layer, 108, 208 hole transport layer, 109, 209 electron transport layer, 110, 210, 228, 302, 303 gate electrode, 111, 211, 227, 304, 305 gate insulation film, 112, 212, 225, 306, 307 source electrode, 113, 213, 226, 308, 309 drain electrode, 114, 214, 312, 313 second organic layer, 115, 215, 221 first protective layer, 116, 216, 222 second protective layer, 117, 217, 223 third protective layer, 118, 218, 224 active layer, 119, 219 color filter, 130, 230 planarization film, 300 rib, 315, 316 protective layer

BEST MODES FOR CARRYING OUT THE INVENTION

Hybrid Organic Light-Emitting Transistor Device

First Embodiment

Figure 1:
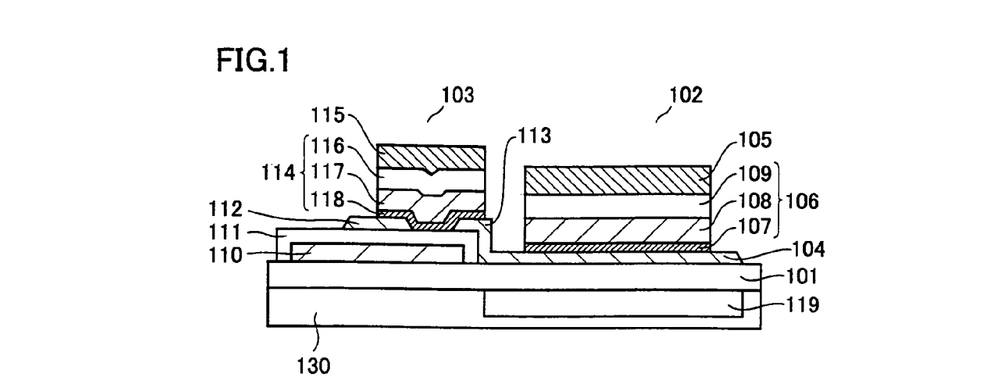
FIG. 1 is a schematic cross section illustrating a preferred embodiment of a hybrid organic light-emitting transistor device of the present invention.

The present invention will be hereinafter described in detail with reference to an embodiment. FIG. 1 is a schematic cross section illustrating a preferred embodiment of a hybrid organic light-emitting transistor device of the present invention. The hybrid organic light-emitting transistor device shown in FIG. 1 includes an organic light-emitting diode device (hereinafter also referred to as OLED device) 102, and an organic thin-film transistor device (hereinafter also referred to as organic TFT device) 103 that are arranged in parallel on a substrate 101. OLED device 102 includes an anode 104, a cathode 105, and a first organic layer 106 placed between anode 104 and cathode 105. First organic layer 106 includes an organic semiconductor layer 107, a hole transport layer 108 and an electron transport layer 109. In the present embodiment, electron transport layer 109 itself also serves as a light-emitting layer. Organic semiconductor layer 107 serves as a hole injection layer. Under OLED device 102 and on the side opposite to OLED device 102 with respect to substrate 101, a color filter 119 for converting the wavelength of light emitted from OLED device 102 is placed. On substrate 101 and color filter 119, a planarization film 130 (protective film) is formed.

Organic TFT device 103 includes a gate electrode 110 formed on substrate 101, a gate insulation film 111 on gate electrode 110, a source electrode 112 and a drain electrode 113 formed on gate insulation film 111, a second organic layer 114 formed on source electrode 112 and drain electrode 113, and a first protective layer 115 laid on second organic layer 114. Second organic layer 114 includes a second protective layer 116, a third protective layer 117 and an active layer 118 of an organic semiconductor material formed between and on source electrode 112 and drain electrode 113 to abut on the source and drain electrodes. First organic layer 106 and second organic layer 114 are spatially separated from each other.

One of the features of the hybrid organic light-emitting transistor device in the present embodiment is that first organic layer 106 of OLED device 102 and second organic layer 114 of organic TFT device 103 have the same structure. Specifically, active layer 118 that is formed between and on source electrode 112 and drain electrode 113 and in contact with the source and drain electrodes, and organic semiconductor layer 107 are of the same organic material, third protective layer 117 and hole transport layer 108 are of the same organic material, and second protective layer 116 and electron transport layer 109 are of the same organic material, and the order in which the layers of organic TFT device 103 are stacked is the same as the order in which the layers of OLED device 102 are stacked. In this structure, first organic layer 106 and second organic layer 114 can be formed without using a shadow mask, so that the distance between OLED device 102 and organic TFT device 103 (device isolation width) can be made smaller. Accordingly, the pixel size can be made smaller, and the ratio of the light emitting portion (organic TFT device) area to the pixel area (aperture ratio) can be made higher. Thus, the brightness per unit area of a resultant organic EL display can be increased.

Further, organic TFT device 103 has first protective layer 115 made of the same material as cathode 105 of OLED device 102 and formed on second organic layer 114. Like the first and second organic layers, cathode 105 and first protective layer 115 are spatially isolated from each other. This structure is advantageous in that cathode 105 can be easily formed and the protective layer can be formed for the organic TFT device, as compared with the case where cathode 105 is selectively formed on only first organic layer 106 of OLED device 102. Namely, if cathode 105 is to be selectively formed on only first organic layer 106, it is necessary to use a shadow mask. In contrast, the structure where organic TFT device 103 has first protective layer 115 allows cathode 105 and first protective layer 115 to be formed at a time without using a shadow mask. First protective layer 115, second protective layer 116 and third protective layer 117 serve to protect the surface of the organic TFT.

In the present embodiment, drain electrode 113 of organic TFT device 103 and anode 104 of OLED device 102 are formed using the same material. Thus, drain electrode 113 and anode 104 can be formed together at the same time, which is advantageous for the manufacturing process.

A description will now be given of respective materials for the layers. Active layer 118 of organic TFT device 103 is made of an organic semiconductor material. As the organic semiconductor material, any of conventionally known organic transistor materials may be used. Such organic transistor materials may include, for example, acenes such as tetracene, pentacene and anthracene, phthalocyanines such as copper phthalocyanine and zinc phthalocyanine, and oligomers such as thiophene oligomer and phenylene oligomer. In consideration of the fact that organic semiconductor layer 107 of OLED device 102 is made of the same material as active layer 118, preferably the material is capable of serving as a hole injection layer. More preferably, the material has a high carrier mobility μ as the organic transistor material.

For active layer 118 of organic TFT device 103 and organic semiconductor layer 107 of OLED device 102, preferably any of organic semiconductor materials represented by formulas (1) to (7) below may be used.

(5)

(6)

(7)

Respective names of the compounds expressed by formulas (1) to (7) are as follows.
(1) 1,6-bis(2-(4-methylphenyl)vinyl)pyrene
(2) 1,6-bis(2-(4-buthylphenyl)vinyl)pyrene
(3) 4,4'-bis(2-(4-octylphenyl)vinyl)biphenyl
(4) 4,4'-bis(2-(4-octylphenyl)vinyl)p-terphenyl
(5) 1,6-bis(2-(4-hexylphenyl)vinyl)biphenyl
(6) 1,4-bis(2-(4-(4-buthylphenyl)phenyl)vinyl)benzene
(7) 4,4'-bis(2-(5-octylthiophene-2-yl)vinyl)biphenyl The organic semiconductor materials expressed by formulas (1) to (7) above are preferably used since these materials have a high carrier mobility μ of approximately 0.1 to 1.0 $cm^2/Vs$ and are almost transparent to light of the visible range.

For hole transport layer 108 and third protective layer 117, any of conventionally known hole transport layer materials may be appropriately selected for use. The hole transport layer materials may include, for example, α-NPD (bis[N-(1-naphthyl)-N-phenyl]benzidine), TPD (N,N-diphenyl-N,N'-bis(3-methylphenyl-1,1'-biphenyl-4,4'-diamine), copper phthalocyanine, m-MTDATA (4,4',4''-tris(3-methylphenylamino) triphenylamine), and the like. In particular, α-NPD and the like are preferred since the glass transition temperature and the carrier mobility of such a material are high. For electron transport layer 109 and second protective layer 116, any of conventionally known electron transport light-emitting materials may be appropriately selected for use. The electron transport light-emitting materials may include, for example, 8-hydroxyquinoline aluminum complex ($Alq_3$), Bathocuproine (BCP), oxadiazole derivatives (such as t-buthyl-PBD ((2-(biphenyl-4-yl)-5-(4-(1,1-dimethylethyl)phenyl)-1,3,4-oxadiazole)), triazole derivatives, and silole derivatives. In particular, $Alq_3$ and the like are preferred since such a material is luminescent and emits light with high efficiency when dopant such as rubrene is added to the material.

As source electrode 112 and drain electrode 113 of organic TFT device 103 and as anode 104 of OLED device 102, a transparent electrode of indium tin oxide (ITO), indium zinc oxide (IZO), PEDOT/PSS or the like may be used. While source electrode 112 and drain electrode 113 of organic TFT device 103 and anode 104 of OLED device 102 are of the same material in the present embodiment, the present invention is not limited to this. In other embodiments, source electrode 112 and drain electrode 113 of organic TFT device 103 and anode 104 of OLED device 102 may be made of different materials. In this case, for source electrode 112 and drain electrode 113, gold, platinum, chromium, tungsten, nickel, copper, aluminum, silver, magnesium, an alloy of any of these materials, or a laminated film of any of these materials, for example, may be used.

For cathode 105 of OLED device 102 and first protective layer 115, any of conventionally known cathode materials, such as aluminum, silver and magnesium may be used. Cathode 105 may include a cathode buffer layer of lithium fluoride (LiF), for example.

For gate electrode 110, for example, Al, tantalum (Ta), gold (Au), Ti, Cr or an alloy containing any of them may be used. For gate insulation film 111, silicon dioxide ($SiO_2$), silicon nitride ($Si_3N_4$), tantalum pentoxide ($Ta_2O_5$), alumina, Hf oxide, PZT (lead zirconium titanate) or the like may be used.

As substrate 101, a transparent substrate, such as, for example, glass substrate, plastic substrate of polyester, polyimide or the like, Si, GaAs, GaN, or stainless substrate, may be used. The material for color filter 119 is appropriately selected according to a desired light wavelength.

Second Embodiment

Figure 2:
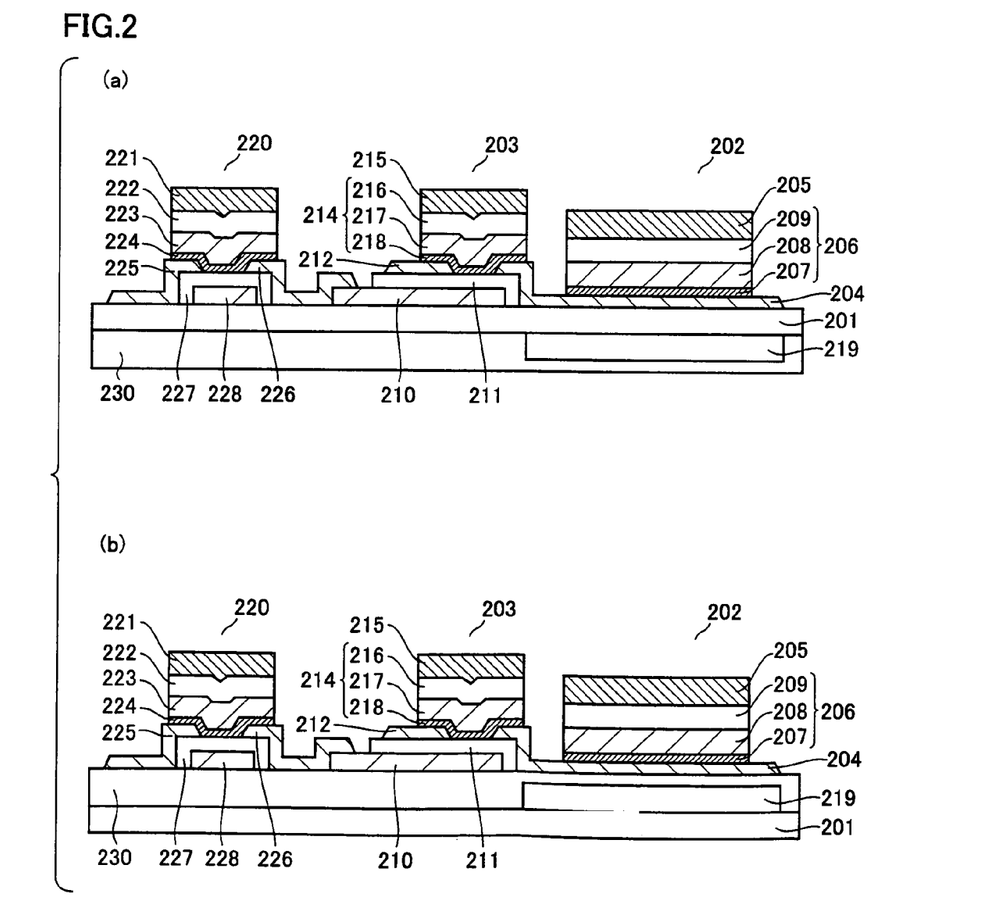
FIG. 2 is a schematic cross section illustrating another preferred embodiment of a hybrid organic light-emitting transistor device of the present invention.

FIG. 2(a) is a schematic cross section illustrating another preferred embodiment of the hybrid organic light-emitting transistor device of the present invention. The hybrid organic light-emitting transistor device of the present embodiment illustrated in FIG. 2(a) is structured similarly to the above-described first embodiment, except that the transistor device of the present embodiment includes two organic TFT devices that are a first organic thin-film transistor device (organic TFT device) 203 for driving an organic light-emitting diode device (OLED device) 202 and a second organic thin-film transistor device (organic TFT device) 220 for selecting a light-emitting pixel. Second organic TFT 220 is structured identically to first organic TFT 203. Namely, an active layer 224 of second organic TFT device 220, an active layer 218 and an organic semiconductor layer 207 are of the same material, a third protective layer 223 of second organic TFT device 220, a third protective layer 217 and a hole transport layer 208 are of the same material, a second protective layer 222 of second organic TFT device 220, a second protective layer 216 and an electron transport layer 209 are of the same material, and a first protective layer 221 of second organic TFT device 220, a first protective layer 215 and a cathode 205 are of the same material, and these layers are laid on each other in the same order. This structure can also provide similar effects to those of the first embodiment. An active matrix circuit can be formed using the hybrid organic light-emitting transistor device of the present embodiment to obtain an organic EL display of a high aperture ratio and accordingly a high brightness per unit area. While the example of FIG. 2(a) as described above provides a color filter and a planarization film (protective film) formed on the side of the substrate opposite to the side where the organic TFT devices and OLED device are formed, the present invention is not limited to this. As shown in FIG. 2(b), the organic TFT devices and OLED device may be formed on the planarization film. This is applied as well to the first embodiment.

Modification

The above-described embodiments may be modified for example in the following manner. Referring now to FIG. 1, the structure of first organic layer 106 may be modified into a structure that the organic EL device may commonly have. Specifically, other organic layers such as light-emitting layer, electron injection layer and hole blocking layer may be provided at appropriate positions. In this case, second organic layer 114 of organic TFT device 103 is also modified identically to first organic layer 106. Here, like the first and second embodiments as described above, preferably active layer 118 of an organic semiconductor material is provided such that active layer 118 is in contact with source electrode 112 and drain electrode 113, and organic semiconductor layer 107 of the same organic semiconductor material is provided as the lowermost layer of first organic layer 106.

Organic semiconductor layer 107 of OLED device 102 may not necessarily function as a hole injection layer. Depending on the organic semiconductor material, the organic semiconductor layer may function as, for example, a hole transport layer. Further, source electrode 112 and drain electrode 113 and anode 104 of OLED device 102 may be made of different materials as described above.

Method of Manufacturing Hybrid Organic Light-Emitting Transistor Device

A description will now be given of a method of manufacturing a hybrid organic light-emitting transistor device of the present invention. This manufacturing method is preferably used as a method for manufacturing the above-described hybrid organic light-emitting transistor device of the present invention. According to the present invention, a method of manufacturing a hybrid organic light-emitting transistor device is provided, the hybrid organic light-emitting transistor device includes at least one organic light-emitting diode device having a first organic layer placed between an anode and a cathode, and at least one organic thin-film transistor device having a second organic layer placed on a source electrode and a drain electrode, and the organic light-emitting diode device and the organic thin-film transistor device are formed on the same substrate. The method includes steps (A) to (F) as follows:

(A) forming a gate electrode of the organic thin-film transistor device on the substrate;

(B) forming a gate insulation film at least partially on the gate electrode;

(C) forming on the gate insulation film the source electrode and the drain electrode of the organic thin-film transistor device and the anode of the organic light-emitting diode device;

(D) forming ribs made of a resist in a predetermined region;

(E) forming the first organic layer and the second organic layer using the same organic material in respective depressed portions formed by the ribs; and (F) forming the cathode of the organic light-emitting diode device on the first organic layer.

Figure 3:
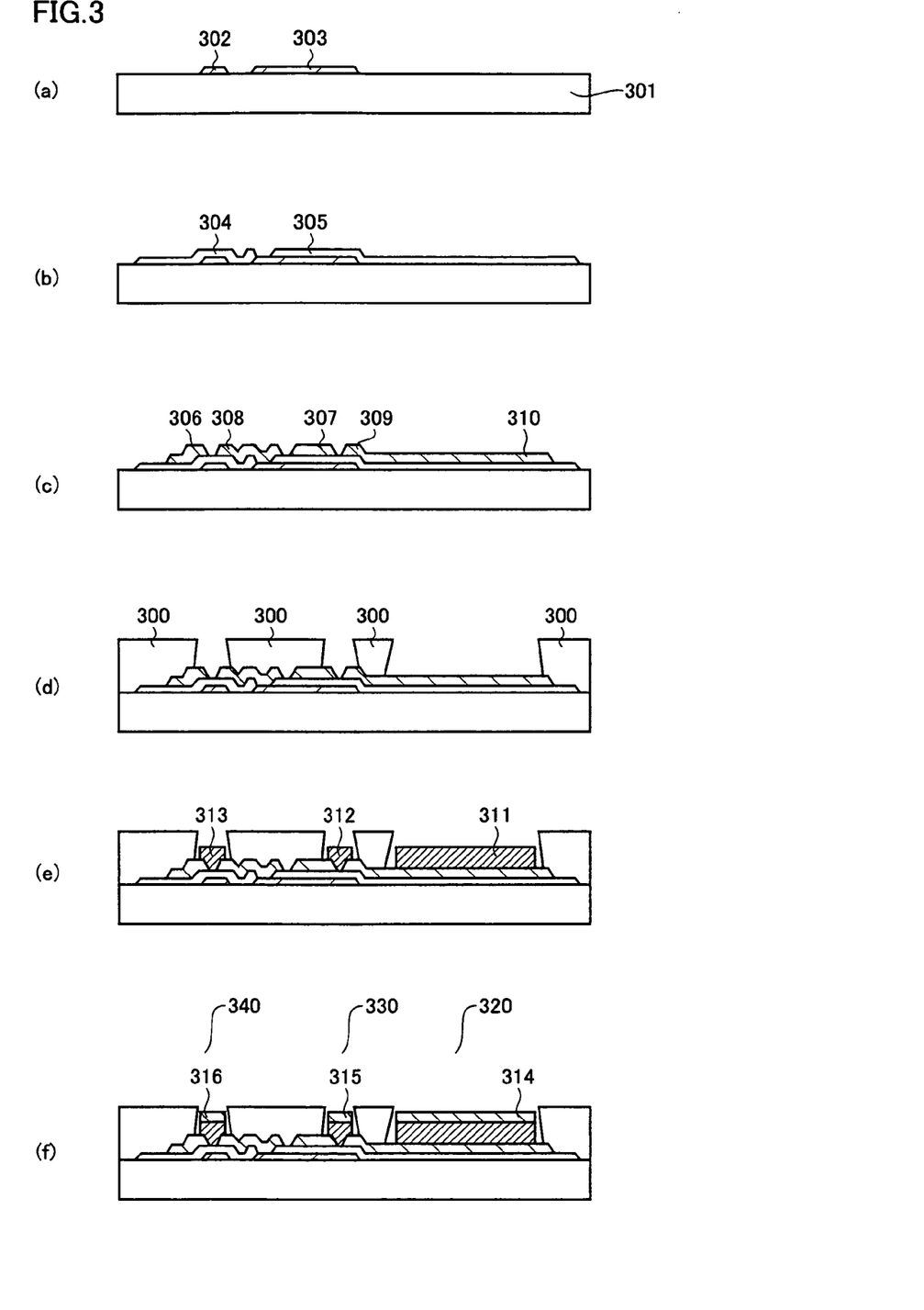
FIG. 3 is a schematic process drawing illustrating a preferred example of a method of manufacturing a hybrid organic light-emitting transistor device of the present invention.

Each of the steps will be described in detail hereinafter with reference to FIG. 3. FIG. 3 is a schematic process drawing illustrating a preferred example of the method of manufacturing a hybrid organic light-emitting transistor device of the present invention, specifically, a method of manufacturing a hybrid organic light-emitting transistor device including two organic thin-film transistor devices and one organic light-emitting diode device on the same substrate.

First, two gate electrodes 302, 303 are formed on a substrate 301 (step (A), FIG. 3(a)). These gate electrodes may be formed, for example, by depositing a gate electrode material on substrate 301 by sputtering or the like, thereafter forming a resist pattern at a portion where the electrodes are to be formed (lithography) and performing wet etching using an etching solution. Next, on gate electrodes 302, 303, gate insulation films 304, 305 are formed (step (B), FIG. 3(b)). The gate insulation films may be formed, for example, by forming a film using a vapor deposition method such as plasma CVD, thereafter forming a resist pattern by lithography and performing etching.

Then, on gate insulation films 304, 305, source electrodes 306, 307 and drain electrodes 308, 309 of the organic thin-film transistor devices (organic TFT devices) as well as an anode 310 of the organic light-emitting diode device (OLED device) are formed (step (C), FIG. 3(c)). These electrodes may be formed by depositing an electrode material on gate insulation films 304, 305 by sputtering or the like, thereafter forming a resist pattern at a portion where the electrodes are to be formed (lithography) and performing wet etching using an etching solution. While anode 310 and drain electrode 309 may be formed of different materials, preferably these electrodes are formed of the same material as an integrated component, in terms of simplification of the manufacturing process.

In the subsequent step, ribs 300 made of a resist are formed in a predetermined region (step (D), FIG. 3(d)). Such ribs 300 may be produced by forming a layer of a resist by a coating method, and thereafter forming a resist pattern by lithography. "Predetermined region" here refers to a region where a first organic layer and a second organic layer are not provided on the gate and drain electrodes and the anode in the subsequent step. In other words, the ribs serve to allow the devices (organic TFT device, OLED device) of the hybrid organic light-emitting transistor device to be formed such that the devices are isolated from each other. Therefore, the width of the rib to be formed can be appropriately adjusted to define the distance between the organic TFT device and the OLED device and/or between the two organic TFT devices (device isolation width) as desired. Accordingly, reduction of the pixel size and improvement of the aperture ratio are achieved. In order to electrically and completely isolate the devices from each other, it is necessary to thoroughly sever and separate the organic layers from each other at the ends of the ribs. It is therefore preferable that each rib 300 is inversely tapered in shape.

Then, in respective depressed portions formed by ribs 300 as described above, first organic layer 311 and second organic layers 312, 313 are formed using the same organic material (step (E), FIG. 3(e)). Specifically, constituent layers of first organic layer 311 and second organic layers 312, 313 are stacked successively by the vacuum deposition method or the like. At this time, first organic layer 311 and second organic layers 312, 313 are formed identically in terms of respective materials for the constituent layers and the order in which the layers are stacked on each other. In this way, first organic layer 311 and second organic layers 312, 313 can be formed together at the same time.

More specifically, as the lowermost layer that is one of the constituent layers of first organic layer 311 and second organic layers 312, 313, a layer of a semiconductor material as described above for example is formed by the vacuum deposition method. This layer can serve as an active layer of the organic TFT devices and a hole injection layer of the OLED device. Before the layer of the semiconductor material is formed, the underlying surface may be hydrophobized using hexamethyldisilazane (HMDS), octadecyltrichlorosilane (OTS), β-phenethyltrichlorosilane (β-Phe), or the like.

Then, on the lowermost layer, layers that are commonly used for the OLED device, such as organic layers serving as for example hole transport layer, light-emitting layer and electron transport layer, are formed by the vacuum deposition method. These layers can serve as protective layers in the organic TFT devices. Thus, the method of the present invention can simultaneously form the organic TFT device and the OLED device in the same process, so that the whole process can be considerably simplified. Further, the conventional problem that the device isolation width has to be kept large has been overcome, since no mask is necessary for forming the first and second organic layers. In addition, deterioration in yield due to dust or the like caused by contact with a mask is also improved.

Next, on first organic layer 311, a cathode 314 of the OLED device is formed by the vacuum deposition method or the like (step (F), FIG. 3(f)). At this time, in a preferred embodiment, protective layers 315, 316 are formed respectively on second organic layers 312, 313 simultaneously with the formation of cathode 314. Thus, at the same time as cathode 314 is formed, the protective layers of the organic TFT devices can be formed. Further, since it is unnecessary to use a mask for forming cathode 314, the effects similar to the above-described ones can be achieved. Finally, ribs 300 are removed and the hybrid organic light-emitting transistor device having OLED device 320 and organic TFT devices 330, 340 is completed.

In the following, the present invention will be described in more detail with reference to an example. The present invention, however, is not limited to this.

EXAMPLE 1

A hybrid organic light-emitting transistor device was produced following the method as illustrated below. Referring to FIG. 3, on substrate 301 that is a glass substrate, aluminum was sputtered to form a layer of a thickness of 100 nm, a resist was thereafter applied onto the aluminum layer, exposed and developed to form a resist pattern. After this, the aluminum layer was wet-etched using an aluminum etching solution to form gate electrodes 302, 303 (FIG. 3(a)). Then, on gate electrodes 302, 303, $SiO_2$ was deposited by the plasma CVD to form a layer of a thickness of 250 nm. After lithography and wet-etching performed similarly to the above-described ones, gate insulation films 304, 305 were formed (FIG. 3(b)).

Subsequently, on gate insulation films 304, 305, indium tin oxide (ITO) was deposited by sputtering to a thickness of 100 nm, lithography and wet-etching were performed similarly to the above-described ones, and thus source electrodes 306, 307 and drain electrodes 308, 309 of the organic TFT devices as well as anode 310 of the OLED device were formed (FIG. 3(c)). Next, a resist was formed to a thickness of 3 μm for the purpose of forming ribs, and the resist at the portion where first and second organic layers are formed was removed to form reverse-tapered ribs 300 (FIG. 3(d)).

Then, in order to form first organic layer 311 and second organic layers 312, 313, an organic semiconductor layer of pentacene was continuously formed by the vacuum deposition method to a thickness of 5 nm, in a region where ribs 300 are not formed. On the organic semiconductor layer, a layer (thickness 40 nm) of α-NPD and a layer (thickness 30 nm) of $Alq_a$ were formed in this order, so that first organic layer 311 and second organic layers 312, 313 were simultaneously formed (FIG. 3(e)). In the organic TFT devices, the layer of pentacene is to serve as an active layer, and the α-NPD layer and $Alq_3$ layer formed thereon are to serve as protective layers. In the OLED device, the layer of pentane is to serve as a hole injection layer, the α-NPD layer is to serve as a hole transport layer and the $Alq_3$ layer is to serve as an electron transport layer and as a light-emitting layer.

Subsequently, an aluminum layer was deposited by the vacuum deposition method to a thickness of 100 nm on first organic layer 311 and second organic layers 312, 313, so that cathode 314 of the OLED device and protective layers 315, 316 of the organic TFT devices were simultaneously formed (FIG. 3(f)). Finally, ribs 300 were removed to obtain the hybrid organic light-emitting transistor device including OLED device 320 and organic TFT devices 330, 340.

Figure 4:
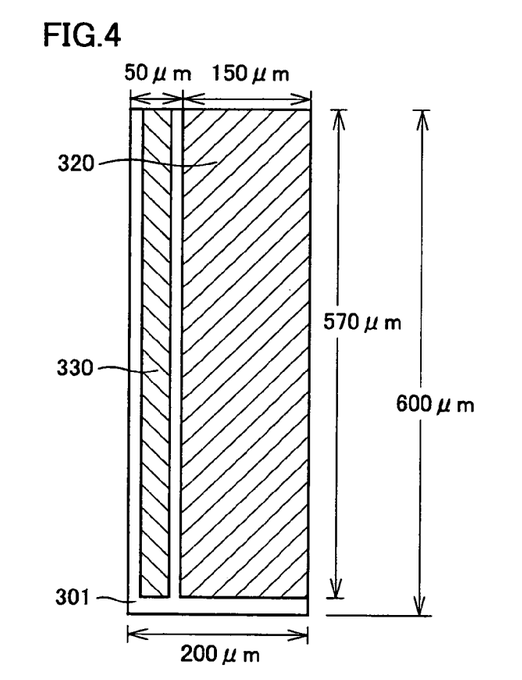
FIG. 4 is a schematic top view illustrating a hybrid organic light-emitting transistor device obtained according to Example 1.

FIG. 4 is a schematic view of a part of the hybrid organic light-emitting transistor device as seen from above, produced according to Example 1, showing the region of OLED device 320 and organic TFT device 330. As shown in FIG. 4, in the hybrid organic light-emitting transistor device of the present invention, the distance between devices formed therein (device isolation width) is considerably short, so that the pixel size can be reduced and the aperture ratio can be increased. In FIG. 4, the aperture ratio as calculated is 71%.

Figure 5:
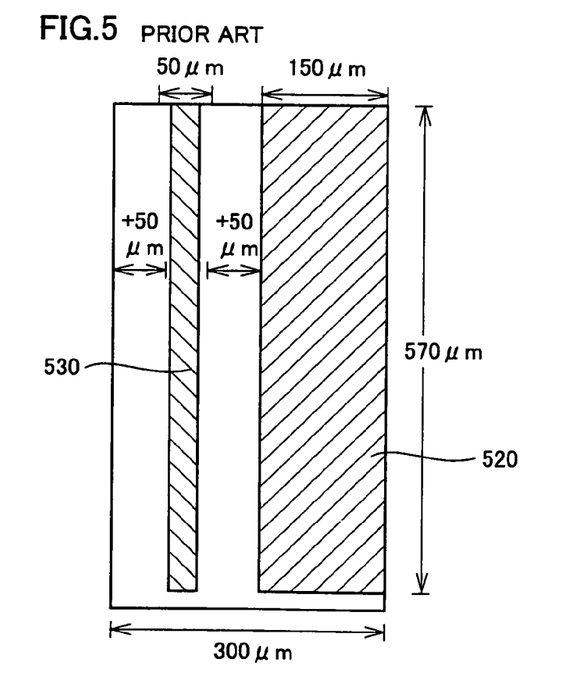
FIG. 5 is a schematic top view of an example of a conventional hybrid organic light-emitting transistor device.

In contrast, in the conventional hybrid organic light-emitting transistor device as shown in FIG. 5, when an organic TFT device and an OLED device of respective sizes identical to those of FIG. 4 are to be formed, at least the device isolation width has to be made larger by 50 μm than that of the present invention, in consideration of misalignment of the mask. Thus, the area other than the area of OLED device 520 is larger. In the case of FIG. 5, the aperture ratio is 48%.

It should be construed that embodiments and examples disclosed herein are by way of illustration in all respects, not by way of limitation. It is intended that the scope of the present invention is defined by claims, not by the above description of the embodiments, and includes all modifications and variations equivalent in meaning and scope to the claims.

The invention claimed is:

1. A hybrid organic light-emitting transistor device including at least one organic light-emitting diode device and at least one organic thin-film transistor device placed on the same substrate,
   said organic light-emitting diode device having a first organic layer placed between an anode and a cathode, and said organic thin-film transistor device having a second organic layer placed on a source electrode and a drain electrode,
   said first organic layer and said second organic layer being spatially isolated from each other, and an organic material forming said second organic layer being identical to an organic material forming said first organic layer; wherein said first organic layer and said second organic layer are each constituted of at least two layers, the number of constituent layers of said first organic layer is identical to the number of constituent layers of said second organic layer, and respective organic materials forming the constituent layers of said second organic layer are respectively identical to respective organic materials forming the constituent layers of said first organic layer.

2. The hybrid organic light-emitting transistor device according to claim 1, wherein said second organic layer includes an active layer made of an organic semiconductor material formed in contact with the source electrode and the drain electrode, and said first organic layer includes a hole injection layer made of the same material as the organic semiconductor material forming said active layer.

3. The hybrid organic light-emitting transistor device according to claim 1, wherein said organic thin-film transistor device further has a layer formed on said second organic layer and made of a material identical to a material for said cathode of said organic light-emitting diode device.

4. The hybrid organic light-emitting transistor device according to claim 1, comprising an organic thin-film transistor device for driving said organic light-emitting diode device and an organic thin-film transistor device for selecting a light-emitting pixel.

5. The hybrid organic light-emitting transistor device according to claim 1, further comprising a color filter for converting a wavelength of light emitted from said organic light-emitting diode device.

* * * * *